United States Patent
Hung et al.

(10) Patent No.: US 8,673,730 B2
(45) Date of Patent: Mar. 18, 2014

(54) MANUFACTURING METHOD OF CHARGING CAPACITY STRUCTURE

(75) Inventors: Pei-Chun Hung, Taichung (TW);
Li-Hsun Chen, Taichung (TW);
Chien-hua Tsai, Taichung (TW);
Masahiko Ohuchi, Taichung (TW);
Sheng-chang Liang, Taichung (TW)

(73) Assignee: Rexchip Electronics Corporation, Taichung (TW)

( * ) Notice: Subject to any disclaimer, the term of this patent is extended or adjusted under 35 U.S.C. 154(b) by 149 days.

(21) Appl. No.: 13/301,255

(22) Filed: Nov. 21, 2011

(65) Prior Publication Data
US 2013/0130463 A1 May 23, 2013

(51) Int. Cl.
*H01L 21/20* (2006.01)
(52) U.S. Cl.
USPC ............... 438/397; 438/396; 257/E21.014
(58) Field of Classification Search
USPC ............... 438/481, 486, 494, 396, 397; 257/E21.014
See application file for complete search history.

(56) References Cited

U.S. PATENT DOCUMENTS

| | | | |
|---|---|---|---|
| 5,538,592 A * | 7/1996 | Chen et al. | 438/396 |
| 2004/0241954 A1 | 12/2004 | Chen et al. | |
| 2011/0159662 A1 | 6/2011 | Chung | |

* cited by examiner

*Primary Examiner* — George Fourson, III
*Assistant Examiner* — Wilner Jean Baptiste
(74) *Attorney, Agent, or Firm* — Muncy, Geissler, Olds & Lowe, P.C.

(57) ABSTRACT

A method of manufacturing a charging capacity structure includes steps of: forming a first oxide layer, a support layer and a second oxide layer on a substrate in sequence; forming a plurality of etching holes on the surface of the second oxide layer in a matrix to run through the substrate that are spaced from each other at a selected distance; forming a plurality of pillar layers in the etching holes; removing the second oxide layer by etching; forming an etching protection layer on the surfaces of the support layer and pillar tubes that is formed at a thickness one half of the spaced distance between the etching holes such that the pillar tubes at diagonal locations form a self-calibration hole; and finally removing the first oxide layer from the self-calibration hole by etching. Through the self-calibration hole, the invention needn't to provide extra photoresists to form holes.

8 Claims, 17 Drawing Sheets

MANUFACTURING METHOD OF CHARGING CAPACITY STRUCTURE

FIELD OF THE INVENTION

The present invention relates to a semiconductor manufacturing process and particularly to a method of manufacturing a charging capacity structure.

BACKGROUND OF THE INVENTION

A Dynamic Random Access Memory (DRAM) element generally includes a capacitor to store electric power and incorporates with a transistor switch to store varying charging data. It is fabricated in a matrix structure and collaborates with a bit line and word line to achieve dynamic random access function.

The capacitor usually is fabricated by etching a substrate to form a trench or forming individual conductive transistor and depositing to form conductive layers on or in individual cell in a stacking manner. With advance of manufacturing process, the fixture size is greatly shrunk and the size of single transistor is reduced, hence more transistors and capacitors can be accommodated on a given size of circuit board. As a result, manufacturing cost also is reduced. The capacitor in the memory has to maintain a constant charge capacity which is determined by the distance of two electrodes, area of the two electrodes and dielectric constant of the dielectric layer between the two electrodes. These factors make shrinking the size of capacitor more difficult, consequently shrinking the size of memory also is difficult. How to further reduce production cost depends on reducing manufacturing complexity and process.

U.S. publication Nos. 2004/0241954 entitled "Method for forming a crown capacitor" and 2011/0159662 entitled "Method for fabricating crown-shaped capacitor" respectively disclose a method to fabricate crown-shaped capacitors. They mainly adopt varying approaches to enlarge corresponding area of two opposing electrodes in a capacitor to increase the capacity of the capacitor. They have a drawback of requiring complicated manufacturing processes.

Moreover, aside from enlarging the corresponding area of the electrodes in a capacitor to increase the charge capacity, simplifying fabrication process also helps to increase production yield and reduce the cost. Please refer to FIGS. 1A through 1F for a conventional process of manufacturing a capacitor. First, on a support layer 1, an etching hole 2 is formed thereon to run through an oxide layer 3 connecting to the support layer 1 and a substrate 4 connecting to the oxide layer 3, and a hard photo mask formed by two photoresists is provided prior to the etching process; next, referring to FIG. 1B, a pillar layer 5 is formed on the surfaces of the etching hole 2 and support layer 1; then, referring to FIG. 1C, a protective layer 6 is formed on the surface of the support layer 1; thereafter, referring to FIG. 1D, a third photoresit 7 is formed to facilitate removal of the protective layer 6, pillar layer 5 and support layer 1 by etching as shown in FIG. 1E; and finally, referring to FIG. 1F, the oxide layer 3 is removed via a wet etching process to form a plurality of tubular pillars 8 to finish the upstream fabrication process of the capacitor; thereafter the following fabrication process of the capacitor can be proceeded.

The aforesaid method needs to provide three photoresists to form the upstream structure. Production cost is higher. Moreover, the tubular pillars 8 formed by the pillar layer 5 have a greater aspect ratio; during the final wet etching process of removing the oxide layer 3, viscous effect caused by pulling out the upstream structure from the etching solution results in bending of the tubular pillars 8. That could affect the manufacturing quality of the capacitor in downstream process and reduce the production yield.

SUMMARY OF THE INVENTION

The primary object of the present invention is to reduce manufacturing processes to lower production cost.

Another object of the invention is to solve the problem of a greater aspect ratio of the structure that causes bending phenomenon and results in lower production yield.

To achieve the foregoing objects, the invention provides a method of manufacturing a charging capacity structure that comprises the steps of:

S1: forming a first oxide layer, a support layer and a second oxide layer on a substrate in sequence;

S2: forming a plurality of etching holes on the surface of the second oxide layer that are arranged in a matrix and run through the support layer, first oxide layer and substrate, and are spaced from each other at a selected distance;

S3: depositing a pillar layer on the wall surface of each of the etching holes;

S4: removing the second oxide layer such that a portion of the pillar layer is protruded outside the surface of the support layer to form a plurality of pillar tubes;

S5: forming an etching protection layer on the surfaces of the support layer and pillar tubes that is formed at a thickness equal to one half of the spaced distance between the etching holes so that the pillar tubes at diagonal locations form a self-calibration hole;

S6: removing the etching protection layer and support layer from the self-calibration hole via anisotropic etching;

S7: removing the first oxide layer via wet etching by injecting an etchant into the self-calibration holes to retain the pillar tubes from the pillar layer; and S8: Fabricating capacitors through the pillar tubes by forming a high dielectric layer, an electrode layer and a polycrystalline layer coated on the surfaces of the pillar tubes to finish the manufacturing process. The pillar tubes thus formed also have an upper electrode at one side remote from the substrate to form the capacitors.

By means of the technique set forth above, through etching and removing the first oxide layer in the self-calibration hole formed among the diagonal pillar tubes, the process of defining the etching scope via photoresists can be avoided, hence manufacturing processes can be reduced to lower production cost. In addition, with the support layer located between the first oxide layer and second oxide layer, the phenomenon of excessive aspect ratio can be avoided. As a result, bending problem during the wet etching process also can be prevented.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Please refer to FIGS. 2A through 2E for the method of manufacturing a charging capacity structure of the invention. The method comprises the steps as follows:

S1: Forming a first oxide layer 11, a support layer 12 and a second oxide layer 13 on a substrate 10 in sequence. The substrate 10 and support layer 12 are made of silicon nitride. The first oxide layer 11 and second oxide layer 13 can be made of the same or different materials, and processed via different manufacturing processes according to requirements. The first oxide layer 11 and second oxide layer 13 can be made of silicon dioxide, borophosphosilicate glass, phosphorosilicate glass or the like, and fabricated via manufacturing processes such as tetraethoxysilane (TEOS), phosphorus-TEOS (PTEOS), low pressure tetraethoxysilane, (LPTEOS), boron-phosphorus-TEOS, high density plasma (HDP), or spin-on dielectric (SOD). The first oxide layer 11 is formed at a thickness ranged from 500 nm to 3000 nm, and the second oxide layer 13 is formed at a thickness ranged from 100 nm to 600 nm.

Figure 1A:
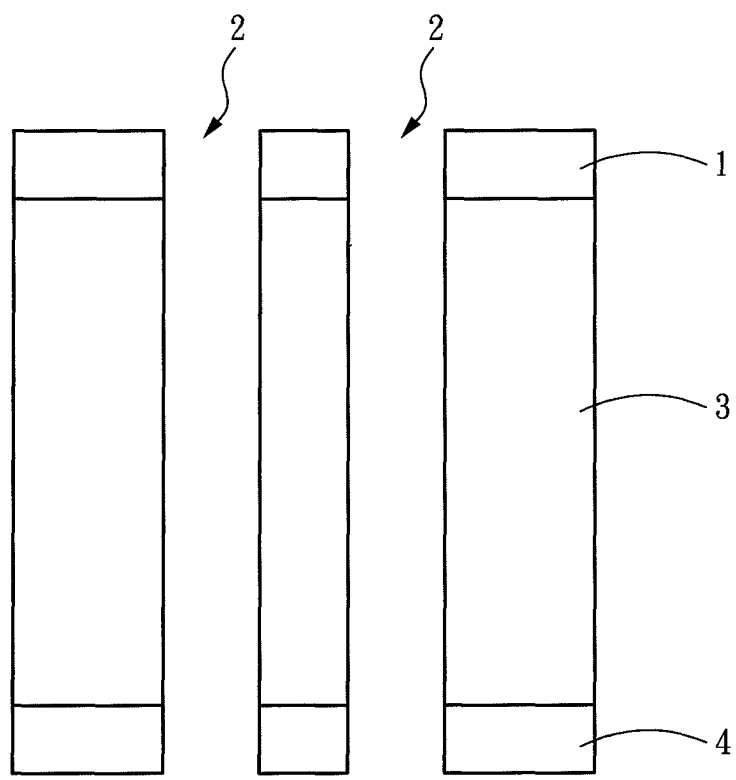
FIGS. 1A through 1F are schematic views of upstream manufacturing processes for fabricating capacitors according to the conventional techniques.
Figure 1B:
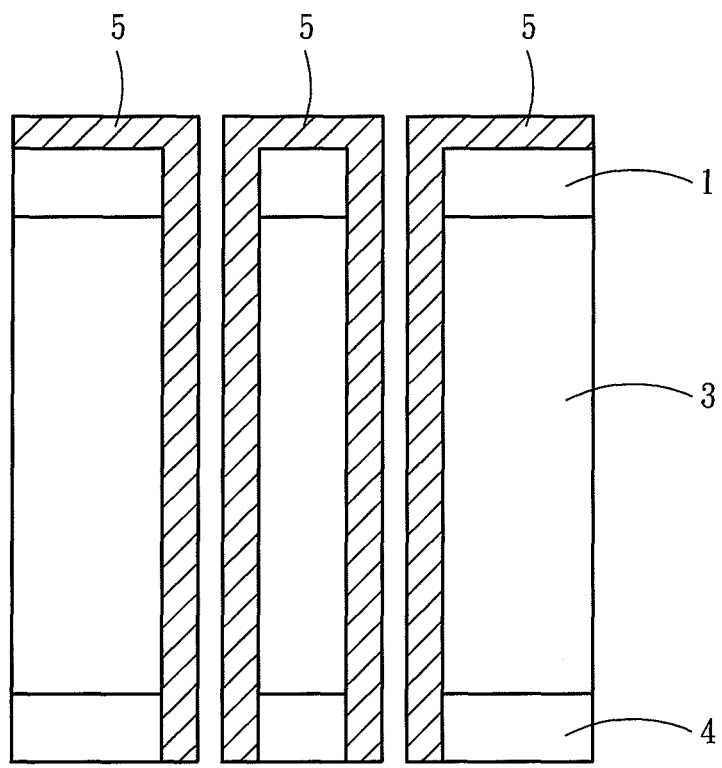
Figure 1C:
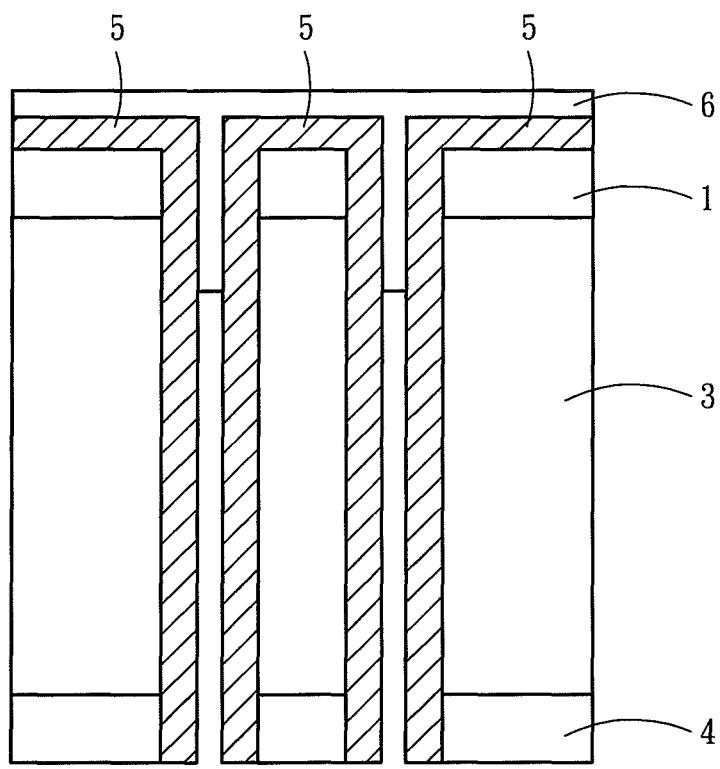
Figure 1D:
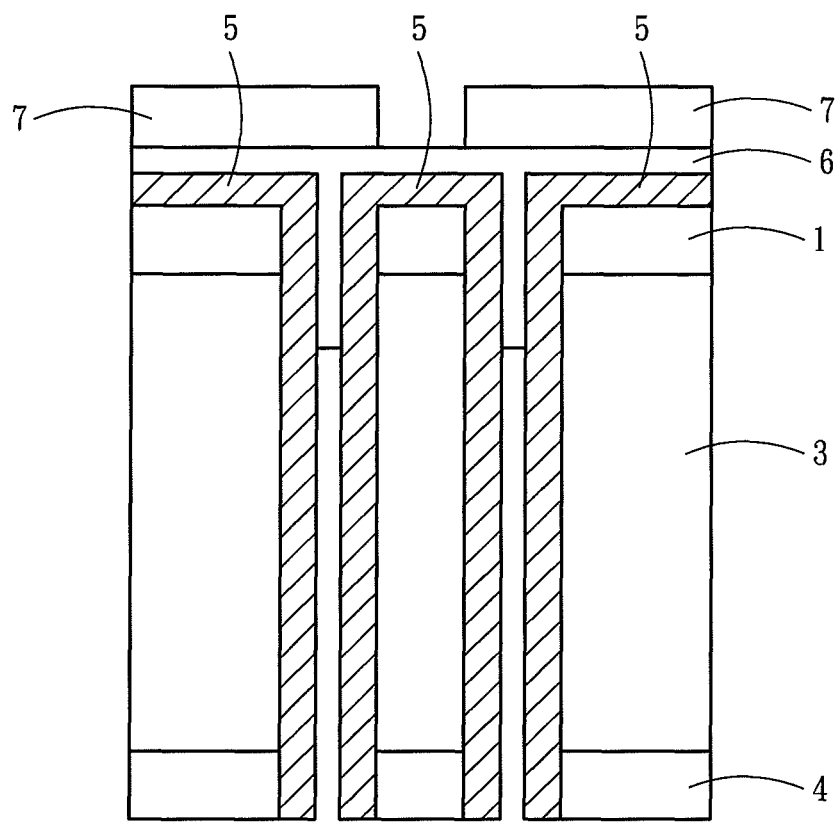
Figure 1E:
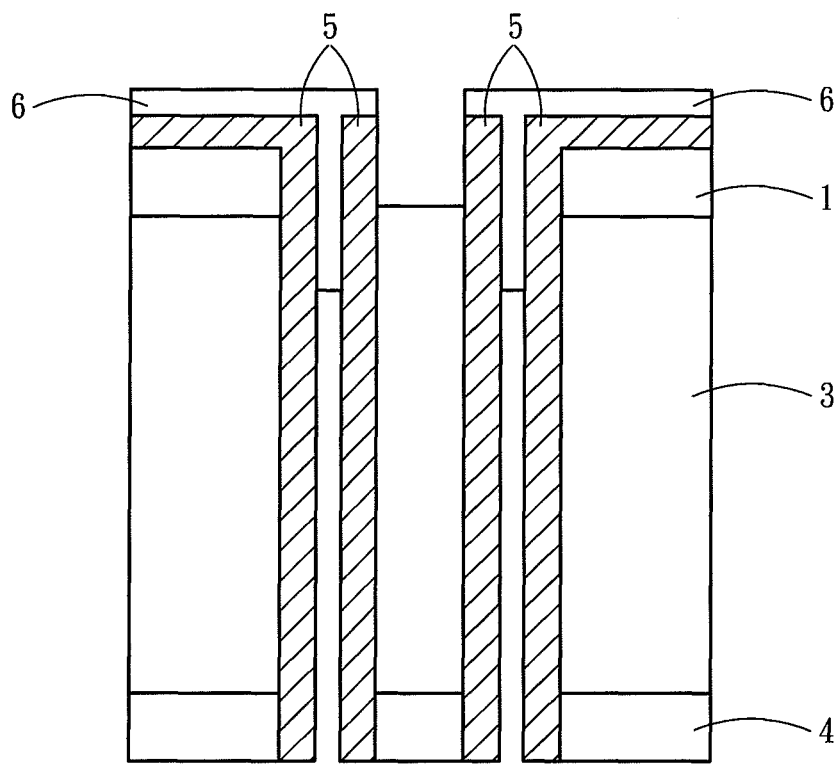
Figure 1F:
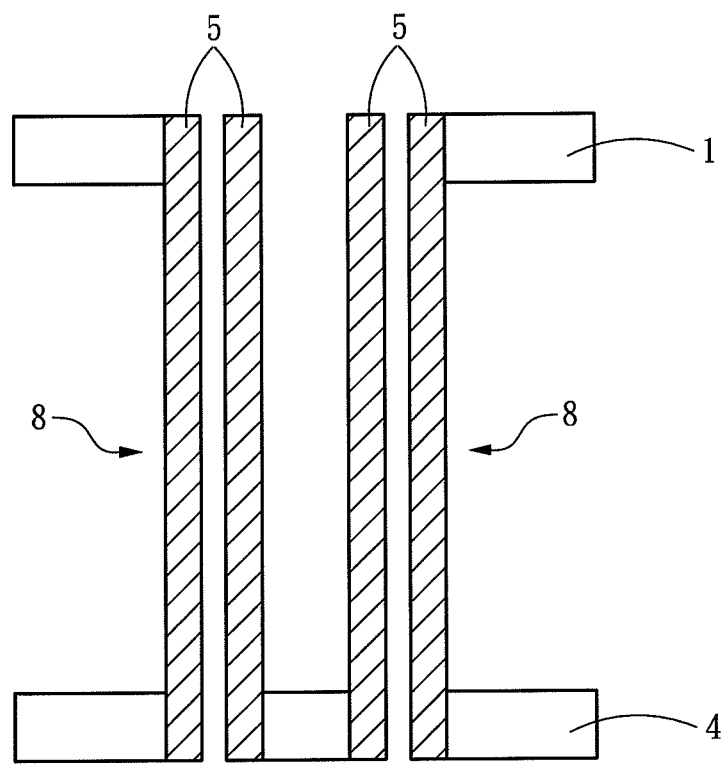
Figure 2A:
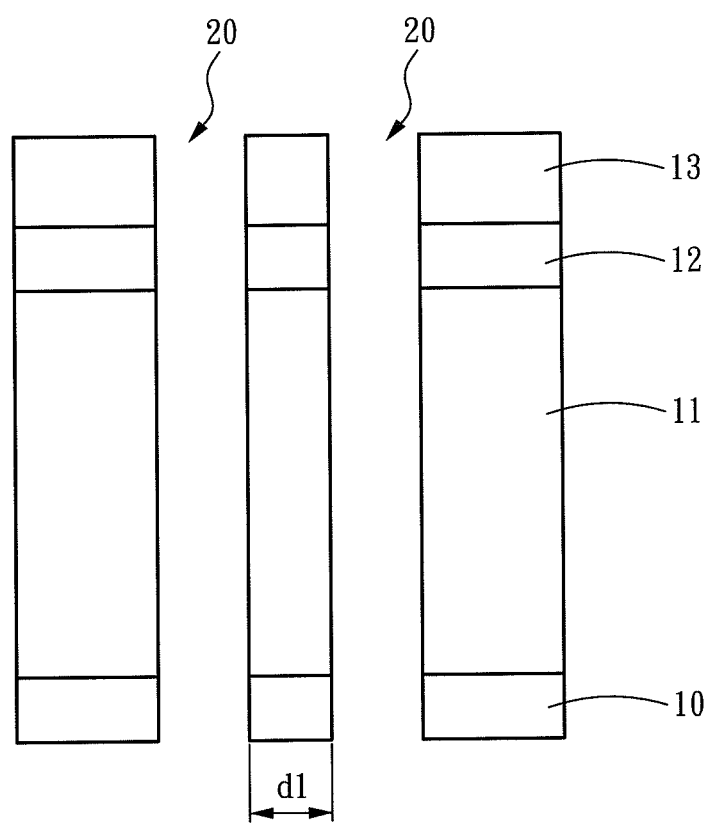
FIGS. 2A through 2E are schematic views of manufacturing processes of an embodiment of the invention.

S2: Forming a plurality of etching holes 20 as shown in FIG. 2A. The invention takes DRAM as an embodiment to facilitate discussion. The etching holes 20 are formed on the surface of the second oxide layer 13 and arranged in a matrix, run through the support layer 12, first oxide layer 11 and substrate 10, and are spaced from each other at a selected distance d1.

Figure 2B:
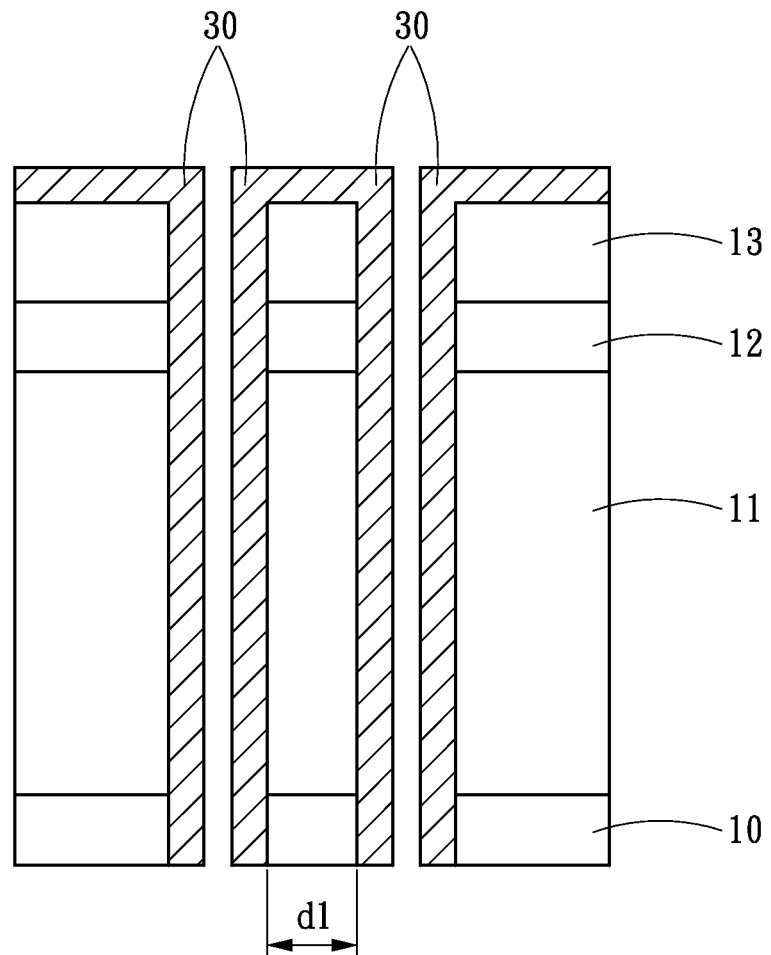
Figure 2C:
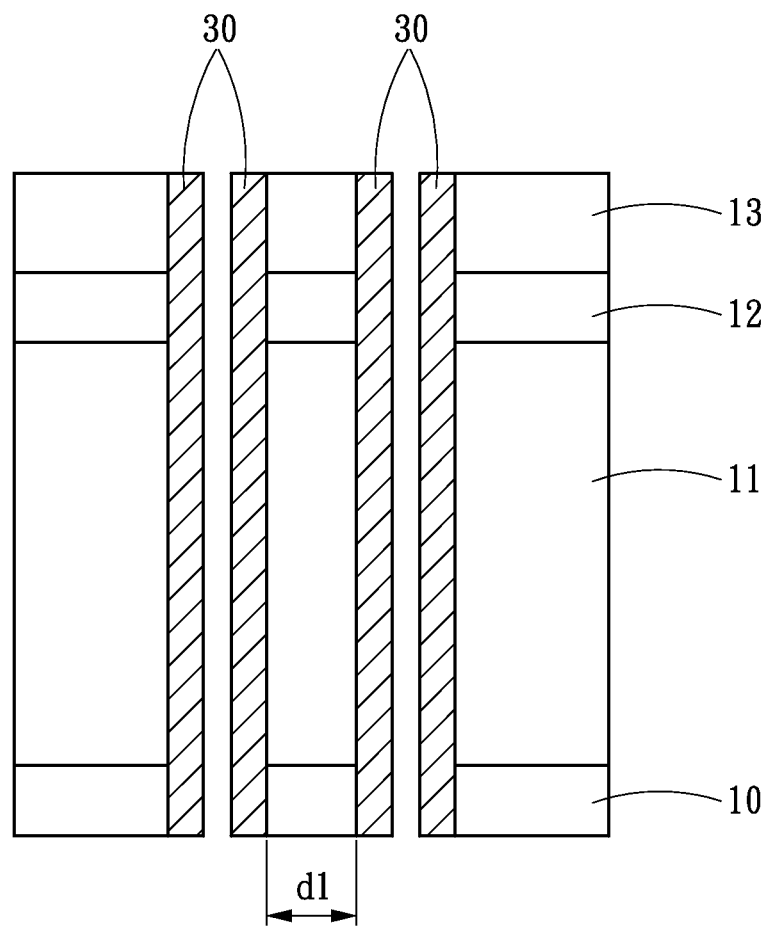

S3: depositing a pillar layer 30 on the wall surface of each of the etching holes 20. This step further includes the following processes as shown in FIGS. 2B and 2C:

S31: Forming the pillar layer 30 on the surfaces of the second oxide layer 13 and etching holes 20 by deposition as shown in FIG. 2B; and S32: Removing the pillar layer 30 on the second oxide layer 13 remote from the support layer 12 so that the upper surface of the second oxide layer 13 forms a flat structure as shown in FIG. 2C. The pillar layer 30 can be made of titanium nitride.

Figure 2D:
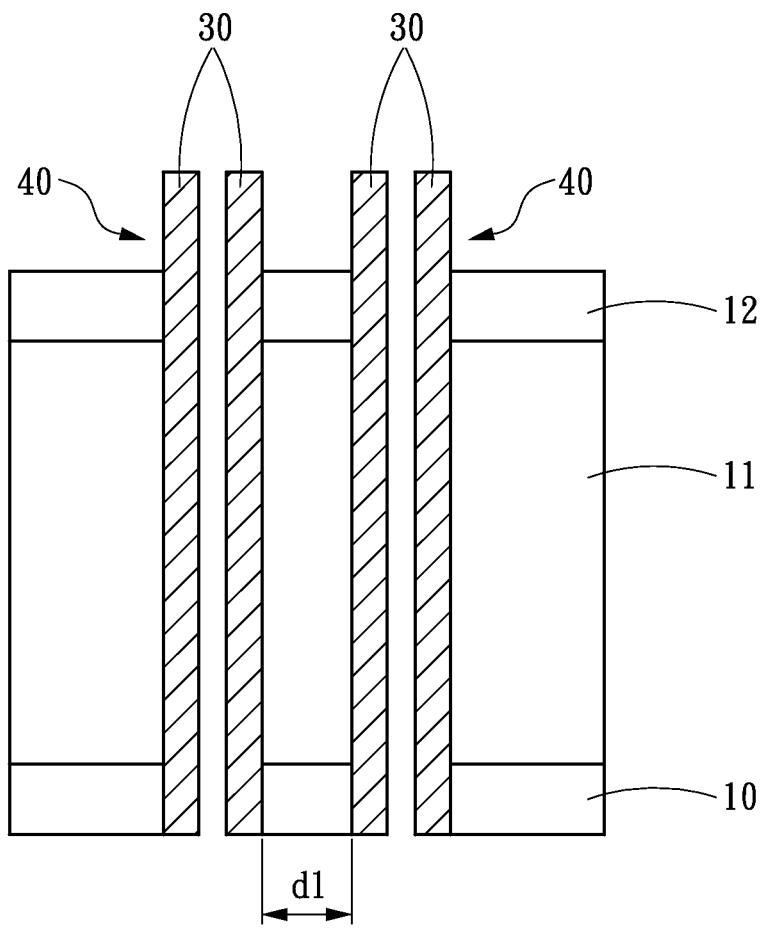

S4: Removing the second oxide layer 13 as shown in FIG. 2D, is such that a portion of the pillar layer 30 is protruded outside the surface of the support layer 12 to form a plurality of pillar tubes 40.

Figure 2E:
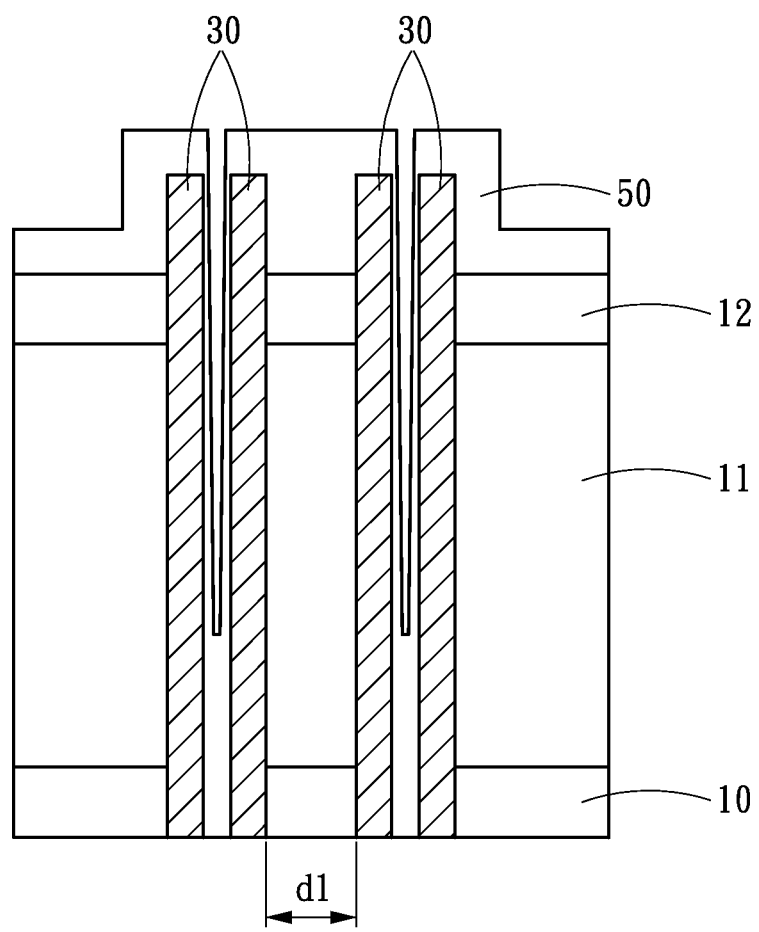
Figure 3:
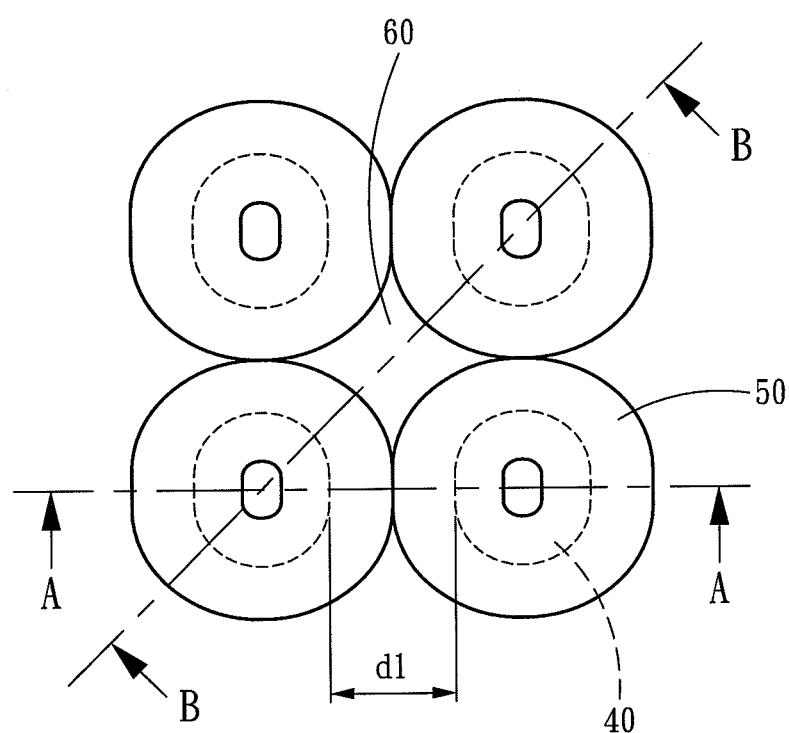
FIG. 3 is a top view of the structure of an embodiment of the invention.
Figure 4A:
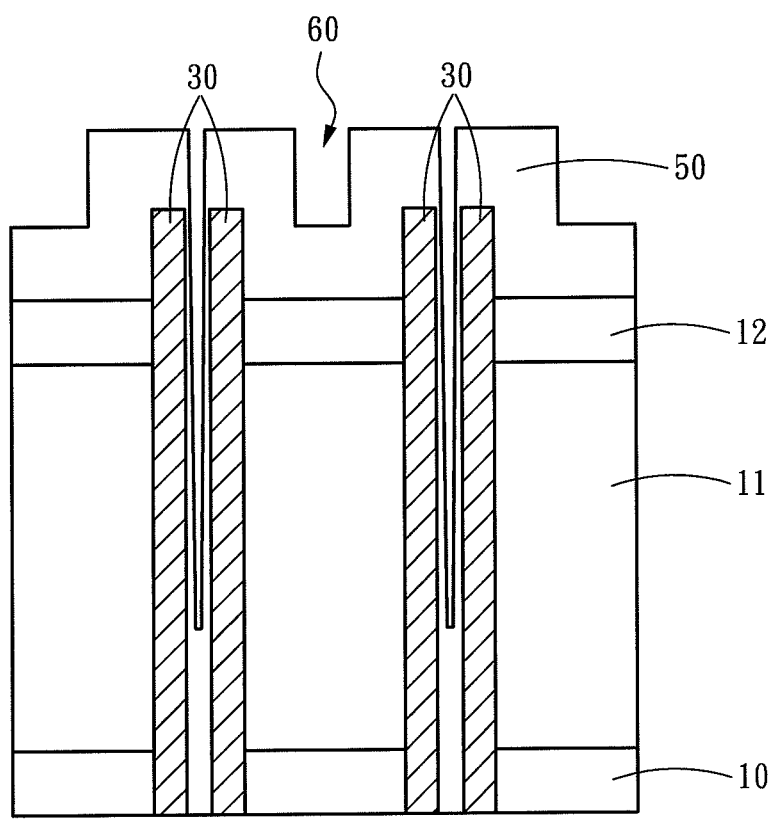
FIGS. 4A through 4C are schematic views of an embodiment of the invention.

S5: Forming an etching protection layer 50 on the surfaces of the support layer 12 and pillar tubes 40 as shown in FIG. 2E. Also refer to FIG. 3 with a cross section taken on line A-A for FIG. 2E. The etching protection layer 50 is formed at a thickness equal to one half of the spaced distance d1 so that no gap is formed between neighboring pillar tubes 40. Also refer to FIG. 4A which is the cross section taken on line B-B in FIG. 3. The pillar tubes 40 located diagonally are spaced from each other at a greater distance. Takes a square as an example, it has one side formed at a length x, the diagonal length is $\sqrt{2}$x. With the etching protection layer 50 formed at a thickness one half of the spaced distance d1, the pillar tubes 40 at the diagonal locations are spaced from each other at a greater distance, hence a self-calibration hole 60 is formed among them. In this embodiment, the etching protection layer 50 is formed via atomic layer deposition (ALD) to get the same thickness.

Figure 4B:
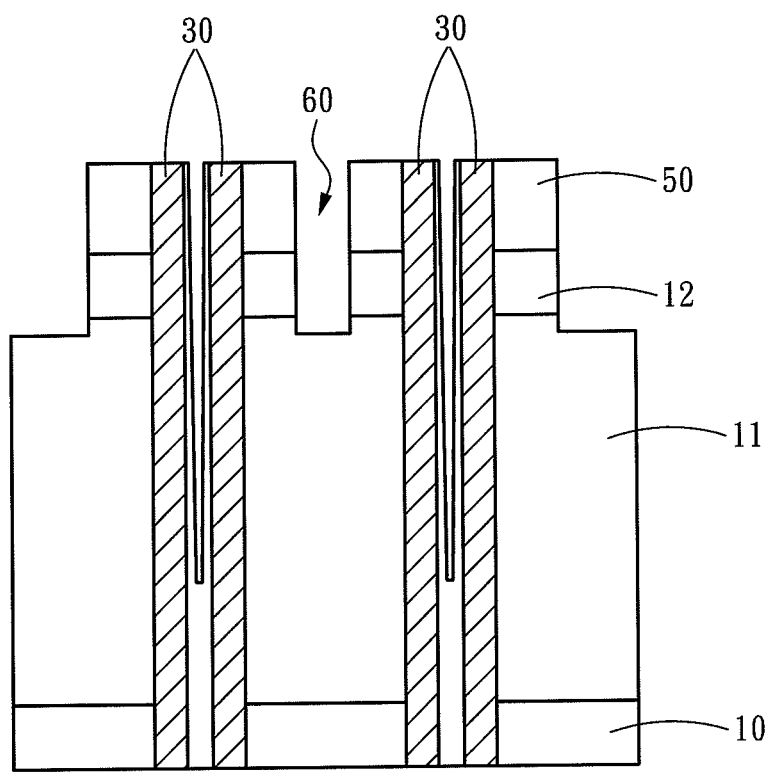

S6: Removing the etching protection layer 50 and support layer 12 from the self-calibration hole 60 via anisotropic etching (also called selective etching) in a vertical downward manner as shown in FIG. 4B. While FIG. 4B shows merely two pillar tubes 40 as an example, in fact there are other pillar tubes 40 on two sides thereof.

Figure 4C:
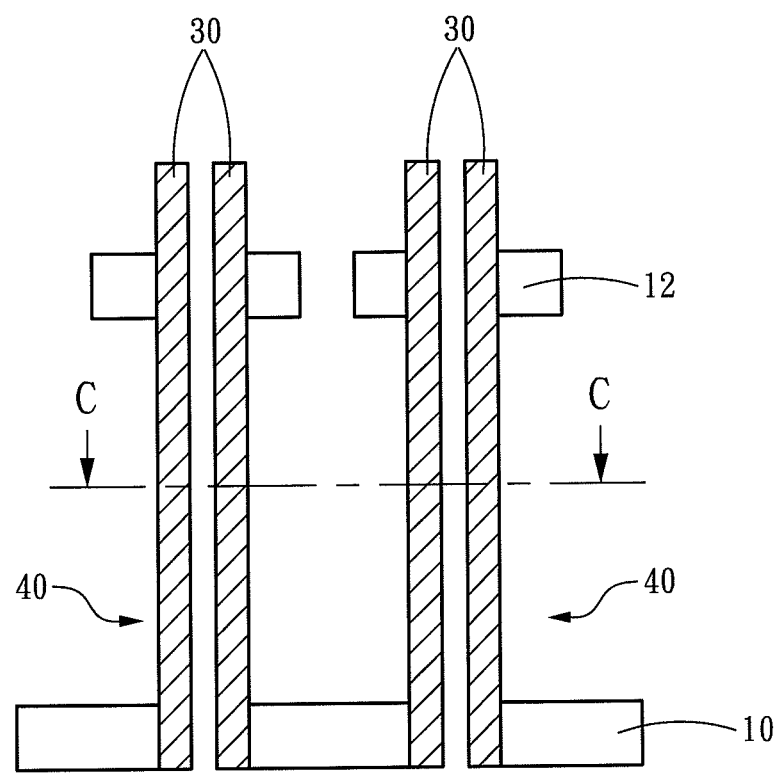
Figure 5:
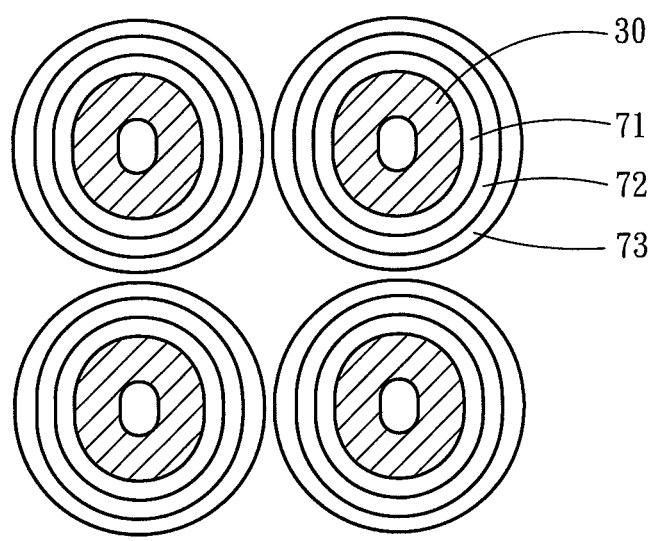
FIG. 5 is a top view of a capacitor manufacturing process of an embodiment of the invention.
Figure 6:
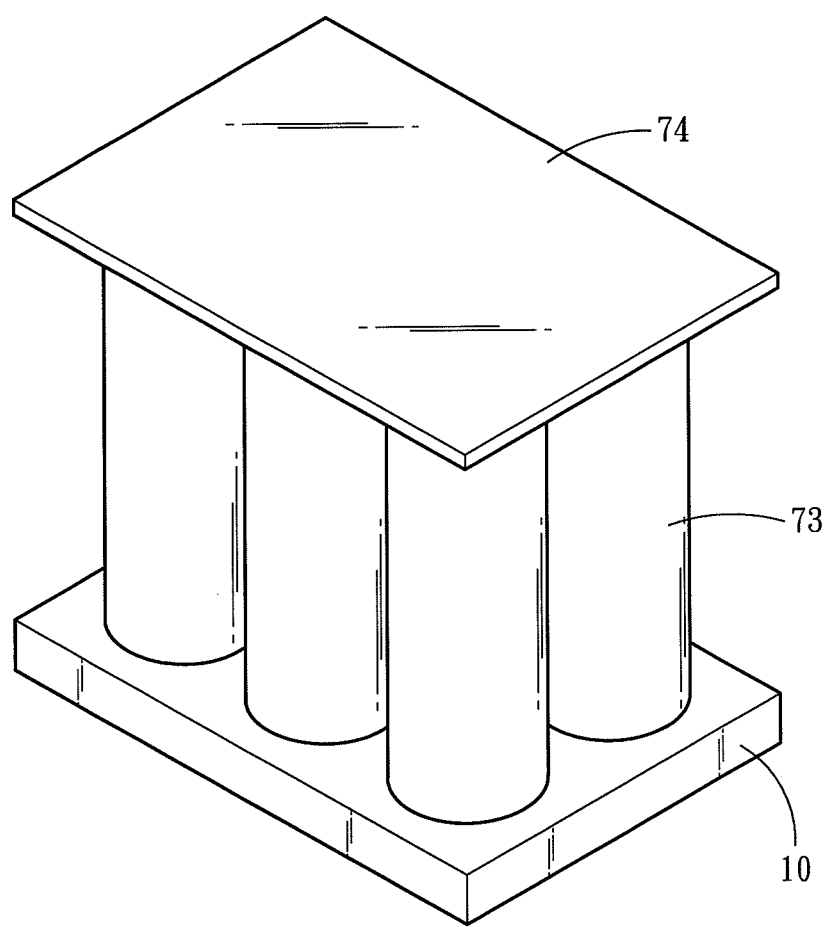
FIG. 6 is a perspective view of a capacitor manufacturing process of an embodiment of the invention.

S7: Removing the first oxide layer 11 via wet etching by injecting an etchant into the self-calibration hole 60 to retain the pillar tubes 40 from the pillar layer 30 as shown in FIG. 4C; and S8: Fabricating capacitors through the pillar tubes 40 as shown in FIG. 5 which is a cross section taken on line C-C in FIG. 4C and shows the downstream process by forming a high dielectric layer 71, an electrode layer 72 and a polycrystalline layer 73 coated on the surfaces of the pillar tubes 40 to finish the manufacturing process. Also referring to FIG. 6, the pillar tubes 40 also have one side remote from the substrate 10 with an upper electrode 74 located thereon.

As a conclusion, the invention etches and removes the first oxide layer 11 in the self-calibration hole 60 formed among the diagonal pillar tubes 40, the process of defining the etching scope via photoresists can be avoided, hence manufacturing processes can be reduced to lower production cost. In addition, with the support layer 12 located between the first oxide layer 11 and second oxide layer 13, the phenomenon of excessive aspect ratio can be avoided, thus the bending problem during the wet etching process also can be prevented. It provides significant improvements over the conventional techniques.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A method of manufacturing a charging capacity structure, comprising the steps of:
    S1: forming a first oxide layer, a support layer and a second oxide layer on a substrate in sequence;
    S2: forming a plurality of etching holes on a surface of the second oxide layer in a matrix to run through the support layer, the first oxide layer and the substrate, the plurality of etching holes being spaced from each other at a selected distance;
    S3: depositing a pillar layer on a wall surface of each of the plurality of etching holes;
    S4: removing the second oxide layer to allow a portion of the pillar layer to protrude outside a surface of the support layer to form a plurality of pillar tubes;
    S5: forming an etching protection layer on the surface of the support layer and on surfaces of the plurality of pillar tubes that is formed at a thickness equal to one half of a spaced distance between the etching holes, the pillar tubes at diagonal locations forming a self-calibration hole;
    S6: removing the etching protection layer and the support layer in the self calibration hole via anisotropic etching;
    S7: removing the first oxide layer via wet etching by injecting an etchant into the self-calibration hole to retain the pillar tubes formed from the pillar layer; and
    S8: fabricating capacitors through the pillar tubes.

2. The method of claim 1, wherein the first oxide layer and the second oxide layer at the step S1 are made of a same material selected from the group consisting of silicon dioxide, borophosphosilicate glass and phosphorosilicate glass.

3. The method of claim 1, wherein the first oxide layer at the step S1 is formed at a thickness ranged from 500 nm to 3000 nm and the second oxide layer is formed at a thickness ranged from 100 nm to 600 nm.

4. The method of claim 1, wherein the substrate and the support layer at the step S1 are respectively made of silicon nitride.

5. The method of claim 1, wherein the step S3 further includes the steps of:
   S31: forming the pillar layer on surfaces of the second oxide layer and the etching holes by deposition; and
   S32: removing the pillar layer deposited on the surface of the second oxide layer.

6. The method of claim 1, wherein the pillar layer at the step S3 is made of titanium nitride.

7. The method of claim 1, wherein the etching protection layer at the step S5 is formed via atomic layer deposition.

8. The method of claim 1, wherein the surfaces of the pillar tubes at the step S8 are coated by a high dielectric layer, an electrode layer and a polycrystalline layer in sequence to form the capacitors.

* * * * *